United States Patent [19]
> Abraham et al.

[11] 4,063,812
[45] Dec. 20, 1977

[54] PROJECTION PRINTING SYSTEM WITH AN IMPROVED MASK CONFIGURATION

[75] Inventors: Gerard Abraham, Versailles; Gaston Bergasse, Melun, both of France

[73] Assignee: International Business Machines Corporation, Armonk, N.Y.

[21] Appl. No.: 713,948

[22] Filed: Aug. 12, 1976

[51] Int. Cl.² .................. G03B 27/00; G03B 27/28
[52] U.S. Cl. .................................. 355/18; 355/125
[58] Field of Search ............... 355/18, 27, 46, 54, 355/63, 132, 133, 43, 45, 30, 52, 53, 75, 77, 40, 73, 125

[56] References Cited

U.S. PATENT DOCUMENTS

| | | | |
|---|---|---|---|
| 2,463,093 | 3/1949 | Felder | 355/133 |
| 2,578,282 | 12/1951 | Bliss | 428/204 |
| 3,397,613 | 8/1968 | Kallenberg | 355/96 X |
| 3,598,490 | 8/1971 | Yearsley | 355/40 X |
| 3,644,134 | 2/1972 | Widmann et al. | 117/45 |
| 3,674,488 | 7/1972 | Dodd et al. | 96/44 |
| 3,676,002 | 7/1972 | Moreau et al. | 355/133 |
| 3,715,244 | 2/1973 | Szupillo | 148/31.5 |
| 3,729,316 | 4/1973 | Castrucci et al. | 96/36.2 |
| 3,743,417 | 7/1973 | Smatlak | 355/133 X |
| 3,769,895 | 11/1973 | Lucas | 355/40 X |
| 3,811,893 | 5/1974 | Gerardus et al. | 355/125 X |
| 3,815,978 | 6/1974 | Marinace | 350/311 |
| 3,867,153 | 2/1975 | MacLachlan | 96/79 |
| 3,892,973 | 7/1975 | Coquin et al. | 250/505 |
| 3,934,081 | 1/1976 | Schumacher | 178/6.8 |

OTHER PUBLICATIONS

I.B.M. Technical Disclosure Bulletin, vol. 18, No. 10, 3/1976, pp. 3360-3364, Package Mask for Photolithography G. VIA.
I.B.M. Technical Disclosure Bulletin, vol. 8, No. 11, 4/1966, Schaible, p. 1575.
I.B.M. Technical Disclosure Bulletin, Sybalsky et al., vol. 11, No. 5, 10/1968, p. 567.
I.B.M. Technical Disclosure Bulletin, Sybalsky, vol. 14, No. 1, 6/1971, p. 249.

*Primary Examiner*—Donald A. Griffin
*Attorney, Agent, or Firm*—David M. Bunnell

[57] ABSTRACT

In a projection printing system the pattern mask, whose image is projected onto a light sensitive layer, is encased in a glass sandwich so that any dirt particles on the surfaces of the sandwich are out of focus and are not printed in the light sensitive layer.

8 Claims, 3 Drawing Figures

PROJECTION PRINTING SYSTEM WITH AN IMPROVED MASK CONFIGURATION

BACKGROUND OF THE INVENTION

This invention relates generally to projection printing and more specifically to a projection printing system having a pattern mask structure which avoids the printing of contamination particles.

In the manufacture of integrated circuits, the various devices and circuit connections are formed using photoresist masks to protect the semiconductor substrate except in the areas where processing, such as etching or metal deposition, is desired to occur.

The photoresist masks are formed by coating the substrate with a layer of resist and then patternwise exposing the resist by passing ultraviolet light through the apertures of a pattern mask. The light causes the resist layer in the light struck areas to either harden, in the case of a negative resist, or to degrade, in the case of a positive resist. The unhardened or degraded areas are then removed by a developer to expose portions of the substrate for processing. The pattern masks are usually formed of a transparent substrate with a pattern of opaque areas of, for example, silver or chromium formed on one surface.

In the past, three types of resist printing have been used. The most common method is contact printing in which the patterned surface of the mask is pressed into contact with the resist layer. This has the disadvantage of limited mask life due to dirt pickup and physical damage to the mask resulting from the contact between the mask and substrate. The image size is also limited to a 1 to 1 reproduction. Proximity printing has been used to reduce contact damage. The image size is still limited to a 1 to 1 reproduction and a new problem is introduced by the out of contact exposure because of light diffraction effects which can reduce resolution and cause ghost images. More recently, projection printing using high quality projection lenses has been employed. The separation of mask and substrate not only prolongs mask life, as in the case of proximity printing, but provides the ability to form not only 1 to 1 reproductions but reduced size images on the substrate. The mask image can then be, for example, 2 to 10 times the size of the image formed on the substrate. This makes the formation and checking of suitable masks easier because the images are larger. It also has the advantage that errors in the mask are reduced in size in the image formed on the substrate so that mask errors which would be harmful in a 1 to 1 magnification ratio system can be ignored. One disadvantage which has been found with projection printing is its sensitivity to particles of contamination which collect on the transparent areas of the patterned surface of the mask. Because the system is designed to bring the mask pattern image into sharp focus on the photoresist layer surface, the contamination particles are also brought into sharp focus with optimum resolution and contrast at the substrate plane so that the images of the larger particles are printed in the resist layer. This problem is compounded with systems which reduce the size of the image because of the much larger relative size of the mask area. This greatly increases the probability of contamination particles of a size large enough to print being located on a transparent area of the mask pattern even in a clean room environment.

The invention provides an improved projection printing system which avoids the printing of mask contamination particles in the light sensitive layer.

BRIEF SUMMARY OF THE INVENTION

In accordance with this invention, a projection printing system for forming an image on a light sensitive substrate is provided which comprises: a mask which includes a transparent substrate with a pattern of opaque and transparent areas formed on one surface thereof, an illuminating system for directing light through the pattern mask to the light sensitive substrate, optical means for forming a focussed image of the mask on the light sensitive substrate, and a transparent layer covering the mask pattern. The transparent layer and mask substrate have thicknesses such that any contamination particles on the free surfaces of the transparent layer and substrate are not printed on the light sensitive substrate.

DETAILED DESCRIPTION

Figure 1:
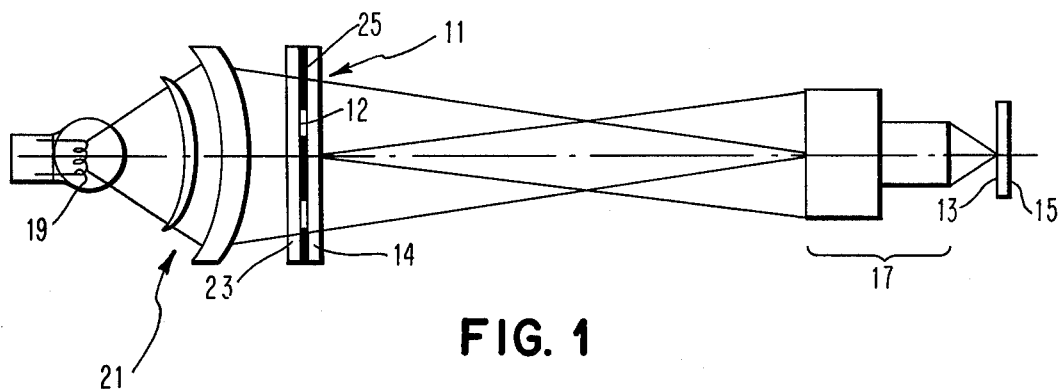
FIG. 1 is a schematic diagram of an optical projection printing system illustrating an embodiment of the invention.
Figure 2:
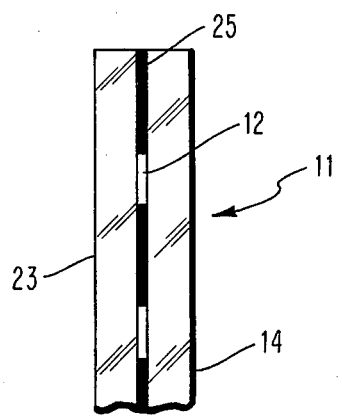
FIG. 2 is a schematic edge view of a sandwich pattern mask.

FIG. 1 illustrates a projection printing system in which a reduced image of a pattern mask 11 is formed on a photoresist layer 13 on substrate 15 by means of a focussing optical system 17 which is, for purposes of illustration, a refracting projection lens. It should be understood that the system of the invention could also have a 1 to 1 magnification ratio and could employ other focussing optical systems which employ mirrors or a combination of refractive and reflective elements. A source 19 of illumination is provided, for example a mercury lamp, with suitable filters and shutters (not shown) and a condensor 21. Mask 11 is conventionally made of a transparent support 23, such as borosilicate glass or quartz with opaque areas 25 of, for example, chromium or silver formed on surface 12 to provide a pattern of adjacent areas of 0 or 1 transmission of light from source 19. In accordance with the invention, mask 11 is provided with a cover plate 14 as further illustrated in FIG. 2.

The mask 11 can be constructed from a square borosilicate glass substrate 23 with a pattern of opaque areas of chromium on surface 12. Cover plate 14 is a transparent layer which can be of the same materials as substrate 23 for expansion coefficient matching but this is not critical. Cover plate 14 is cemented to surface 12 using a refractive index matching transparent optical cement. In order to avoid thermal constraints during curing, a UV cured cement is preferred. Such cements are well known in the art and are commercially available, for example, those marketed by Kodak or Summers Lab Inc.

A suitable cementing procedure is to thoroughly clean the surfaces to be cemented together after which the cement is applied using a 2 micron millipore filter attached to a syringe. Using a mercury lamp with a suitable filter, the mask is placed under the lamp with the cover plate on top so that Newton fringes can be observed. If any contaminants are between the two surfaces to be cemented, a larger number of fringes can be observed which is an indication of the presence of dirt particles. If this occurs, the surfaces are recleaned. If only a small number of fringes are seen, the cover plate is lifted and the cement is applied to the center of the mask using the syringe with the 2 micron filter. The cover plate is then placed over the cement and gently pressed until the fringe pattern observed without the cement is seen. The structure is then inspected with a microscope for bubbles or particles in the cemented surfaces. If defects are observed then the cover plate and mask are separated and recleaned with acetone. If no defects are observed then the structure is placed in a holding fixture and cured with UV light for about 2 hours when using, for example, Summers Lab UV 69 lens bond cement. After curing, excess cement is removed with a razor, or cotton swabs and acetone. The transparent covering layer could also be formed by other means such as by deposition techniques.

Figure 3:
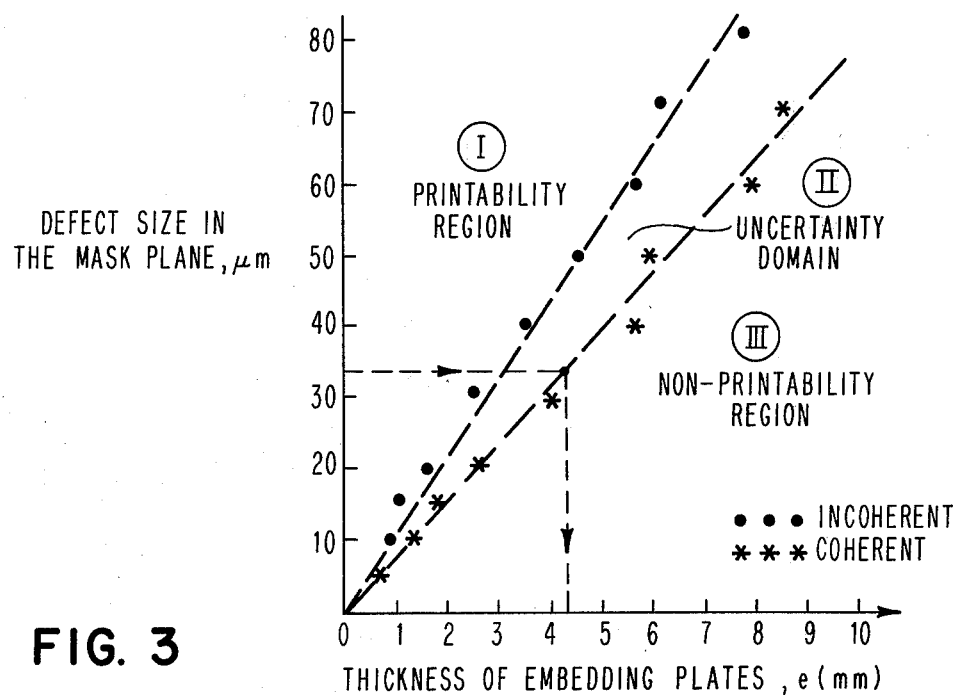
FIG. 3 is a graph illustrating the cover plate thickness required to avoid printing contamination particles of a given size.

The thicknesses of plate 14 and mask substrate 23 are varied depending upon the size of the dirt particles which are expected in the environment. The thickness which is needed to defocus particles of a given size will depend upon the numerical aperture of the projection system. The plots in FIG. 3 illustrate the particle sizes which are defocussed for a given transparent layer of embedding plate thickness for a projection system having a numerical aperture of 0.05 on the mask side. For example, in region I, all points in this region correspond to defects which will be printed. In region III, all points in this region correspond to defects which will not be printed. In domain II, all points in this region correspond to defects the printability of which depends on the transparency of the particle and the coherence of the projection system. As an example of a choice of plate thickness, given an expected particle size of about 35 millimicrons as contamination, the plot shows that the minimum plate thickness necessary for 35 micron particles not to be printed is about 4.4 millimeters. In a typical projection printing system environment it would be reasonable to expect dirt particles in the size and range of up to a maximum of about 50 microns representing the size of skin flakes. An embedding plate thickness of about ¼ inch (6mm) would prevent the printing of such particles with a margin for safety.

The plots in FIG. 3 have been established for a contrast loss of 90%. If a different contrast loss is considered the plots would be reconstructed. The plots are also based on a projection system of a given numerical aperture. Systems having differing numerical apertures would require plate thicknesses somewhat differing from the above plots of FIG. 3 to assure the non-printability of contamination particles of any given size. Some references concerning the calculation of contrast loss in optical systems due to aberrations (i.e., defocussing) are listed below:

W. H. Steel, Revue d'Optique, Volume 31, 1972, p. 334, Volume 32, 1953, p. 4; W. H. Steel, Optica Acta, Volume 3, 1965, p. 65; H. H. Hopkins, Proceedings of the Royal Society A, Volume 231, 1955, p. 91, B, Volume 55, 1943, p. 116, Volume 69, 1956, p. 562, Volume 70, 1956, pps. 449, 1002, and 1162; A. Marechal, Diffraction — Structure des Images — 1970 Editor Masson & Cie, Paris.

From the plots in FIG. 3 it can be seen that a plate thickness of about 6 millimeters or ¼ inch would be sufficient to prevent the printing of the largest particle size which should be anticipated in a normal clean room environment used in photolithography. The invention has the advantage not only of avoiding the printing of defects but the fact that the mask pattern surface is located between cover plates so that it is protected throughout the life of the mask. Should the outer surfaces of the sandwich become scratched, then they can simply be repolished without damaging the mask pattern. This of course would not be practical where scratches occurred on the mask pattern surface itself. A practical range of distances, which the outer surfaces of the transparent layers should be spaced from the plane of the mask pattern of opaque and transparent areas, for most projection systems, taking into account the normal clean room environment, would be from about 1 to 10 millimeters.

While the invention has been particularly described with respect to preferred embodiments thereof it should be understood by one skilled in the art that the foregoing and other changes in form and details may be made therein without departing from the spirit and scope of the invention.

We claim:

1. In a projection printing system for forming an image on a light sensitive substrate, which system includes a mask including a transparent substrate with a pattern of opaque and transparent areas formed on one surface thereof, an illuminating system for directing light through the mask to the light sensitive substrate, and optical means for forming a focussed image of the mask pattern on the light sensitive substrate, the improvement which comprises means for maintaining the images of any dirt particles on the surfaces of the mask out of focus so that the dirt particle images will not be printed on the light sensitive substrate, said means comprisng a transparent layer bonded to said substrate, said layer completely covering said pattern to prevent scratching and contamination thereof, with the thicknesses of the transparent layer and the substrate being such that the images of any dirt particles on the free surfaces of the transparent layer and the substrate are not printed on the light sensitive substrate.

2. The system of claim 1 in which the transparent substrate and the transparent layer have thicknesses of from 1 to 10 millimeters.

3. The system of claim 2 wherein the optical means is a refracting lens system providing an image on the light sensitive layer which is a ratio from 1:1 to 1:10 of image to mask size.

4. The system of claim 1 in which the transparent substrate is a glass plate and the transparent layer is a glass plate which is cemented to the pattern areas.

5. The system of claim 4 wherein the plate has a thickness of 6 millimeters.

6. A projection printing mask comprising a pattern of opaque and transparent areas encased between bonded transparent layers whose outer surfaces are spaced from 1 to 10 millimeters from said pattern, such that the pattern is protected against damage and dirt and the images of any dirt on said outer surfaces are maintained out of focus so that the images will not be printed when the pattern is printed on a light sensitive substrate.

7. In a projection printing system for forming an image on a light sensitive substrate, which system includes a mask including a transparent substrate with a pattern of opaque and transparent areas formed on one surface thereof, an illuminating system for directing light through the mask to the light sensitive substrate, and optical means for forming a focussed image of the mask pattern on the light sensitive substrate, the improvement which comprises means for maintaining the images of any dirt on the surfaces of the mask out of focus so that the images will not be printed on the light sensitive substrate, said means comprising a transparent layer bonded to said substrate, said layer completely covering said pattern to prevent damage and contamination thereof, with the distance that the outer surface of the transparent layer is spaced from said pattern and the thickness of said substrate being such that the images of any dirt on the outer surfaces of the transparent layer and the substrate are not printed on the light sensitive substrate.

8. A projection printing system for forming an image on a light sensitive substrate, which system includes a mask having a pattern of opaque and transparent areas and means to prevent damage and contamination to said pattern, an illuminating system for directing light through the mask to the light sensitive substrate, and an optical means for forming a focussed image of the mask pattern on the light sensitive substrate, said means to prevent damage and contamination to said pattern including transparent layers encasing said pattern, with the distances that the outer surfaces of said transparent layers are spaced from said pattern being such that the images of any dirt particles on said surfaces are maintained out of focus so that the dirt particle images will not be printed on the light sensitive substrate.

* * * * *